United States Patent
Chen (10) Patent No.: US 11,127,846 B2
(45) Date of Patent: Sep. 21, 2021

(54) HIGH ELECTRON MOBILITY TRANSISTOR DEVICES AND METHODS FOR FORMING THE SAME

(71) Applicant: VANGUARD INTERNATIONAL SEMICONDUCTOR CORPORATION, Hsinchu (TW)

(72) Inventor: Chih-Yen Chen, Tainan (TW)

(73) Assignee: VANGUARD INTERNATIONAL SEMICONDUCTOR CORPORATION, Hsinchu (TW)

(*) Notice: Subject to any disclaimer, the term of this patent is extended or adjusted under 35 U.S.C. 154(b) by 52 days.

(21) Appl. No.: 16/510,461

(22) Filed: Jul. 12, 2019

(65) Prior Publication Data

US 2021/0013331 A1 Jan. 14, 2021

(51) Int. Cl.
*H01L 29/778* (2006.01)
*H01L 29/40* (2006.01)
*H01L 29/66* (2006.01)

(52) U.S. Cl.
CPC ......... *H01L 29/778* (2013.01); *H01L 29/407* (2013.01); *H01L 29/66462* (2013.01)

(58) Field of Classification Search
CPC ............. H01L 29/778; H01L 29/66462; H01L 29/407; H01L 29/404; H01L 29/432; H01L 29/402; H01L 29/42316; H01L 29/2003; H01L 29/7786
See application file for complete search history.

(56) References Cited

U.S. PATENT DOCUMENTS

2015/0028384 A1* 1/2015 Cao .................. H01L 29/04
257/140

FOREIGN PATENT DOCUMENTS

| CN | 107452625 A | 12/2017 |
| TW | 201519363 A | 5/2015 |
| TW | 201635525 A | 10/2016 |

OTHER PUBLICATIONS

Taiwanese Office Action adn Search Report dated May 21, 2020 for Application No. 108115807.
Taiwanese Office Action and Search Report dated Sep. 4, 2019 for Application No. 108115807.

* cited by examiner

*Primary Examiner* — Benjamin Tzu-Hung Liu
(74) *Attorney, Agent, or Firm* — Birch, Stewart, Kolasch & Birch, LLP (57) ABSTRACT

A HEMT device includes a gate electrode disposed on a semiconductor layer; a first dielectric layer disposed on the gate electrode and having a first recess on a first side of the gate electrode, wherein a bottom surface of the first recess is lower than a top surface of the gate electrode; a source field plate disposed on the first dielectric layer and extending from a second side of the gate electrode into the first recess; a second dielectric layer disposed on the source field plate; a source electrode disposed on the second dielectric layer and electrically connected to the source field plate; a third dielectric layer disposed on the source electrode; and a drain structure disposed on the first side of the gate electrode and passing through the third dielectric layer, wherein the first recess is located between the drain structure and the gate structure.

20 Claims, 10 Drawing Sheets

HIGH ELECTRON MOBILITY TRANSISTOR DEVICES AND METHODS FOR FORMING THE SAME

BACKGROUND

Technical Field

The embodiments of the present disclosure relate to semiconductor manufacturing, and in particular they relate to semiconductor devices and methods for forming the same.

Description of the Related Art

High electron mobility transistors (HEMT), also known as heterostructure field effect transistors (HFET) or modulation-doped field effect transistors (MODFET), are a type of field effect transistor composed of semiconductor materials having different energy gaps. A two-dimensional electron gas (2DEG) layer is formed adjacent to the interface between different semiconductor materials. The high electron mobility of the 2DEG gives the HEMT advantages such as a high breakdown voltage, high electron mobility, low on-resistance, and low input capacitance, making the HEMT suitable for use in high-power components.

Although these HEMTs generally meet requirements, they are still not satisfactory in every respect, however. Therefore, it is necessary to improve HEMT devices and methods for forming the same, to improve their performance and reliability.

BRIEF SUMMARY

In accordance with some embodiments of the present disclosure, a high electron mobility transistor device is provided. The high electron mobility transistor device includes a gate electrode disposed on a semiconductor layer; a first dielectric layer disposed on the gate electrode and having a first recess on a first side of the gate electrode, wherein the bottom surface of the first recess is lower than the top surface of the gate electrode; a source field plate disposed on the first dielectric layer and extending from the second side of the gate electrode into the first recess; a second dielectric layer disposed on the source field plate; a source electrode disposed on the second dielectric layer and electrically connected to the source field plate; a third dielectric layer disposed on the source electrode; and a drain structure disposed on the first side of the gate electrode and passing through the third dielectric layer, wherein the first recess is located between the drain structure and the gate structure.

In some embodiments, a portion of the first dielectric layer is located between the first recess and the drain structure, and the source field plate does not cover the portion of the first dielectric layer.

In some embodiments, the width of the first recess is greater than the width of the portion of the first dielectric layer.

In some embodiments, the width of the first recess is less than the width of the portion of the first dielectric layer.

In some embodiments, the source electrode extends directly above the portion of the first dielectric layer.

In some embodiments, the second dielectric layer has a second recess located between the first recess and the drain structure, and the source electrode extends into the second recess.

In some embodiments, a bottom surface of the second recess is not lower than the bottom surface of the first recess.

In some embodiments, the bottom surface of the second recess is located in the first dielectric layer.

In some embodiments, the high electron mobility transistor device further includes a source contact disposed on the third dielectric layer and electrically connected to the source electrode.

In some embodiments, the source contact extends directly above the first recess.

In some embodiments, the third dielectric layer has a third recess, wherein the third recess is located between the first recess and the drain structure, and the source contact extends into the third recess.

In some embodiments, a bottom surface of the third recess is not lower than the bottom surface of the first recess.

In some embodiments, the bottom surface of the third recess is located in the first dielectric layer.

According to some embodiments of the present disclosure, a method of forming a high electron mobility transistor device is provided. The method includes forming a gate electrode on a semiconductor layer; forming a first dielectric layer on the gate electrode; performing a first patterning process on the first dielectric layer to form a first recess on a first side of the gate electrode, wherein a bottom surface of the first recess is lower than a top surface of the gate electrode; performing a second patterning process on the first dielectric layer to form a first through hole on the first side of the gate electrode and form a second through hole on the second side of the gate electrode, wherein the first recess is located between the first through hole and the gate electrode; forming a source field plate conformally on the first dielectric layer, wherein the source field plate extends into the second through hole and the first recess; forming a second dielectric layer on the source field plate; forming a source electrode on the second dielectric layer, wherein the source electrode is electrically connected to the source field plate; forming a third dielectric layer on the source electrode; and forming a drain structure in the first through hole.

In some embodiments, a portion of the first dielectric layer is located between the first recess and the drain structure, and the source field plate is etched to expose the portion of the first dielectric layer.

In some embodiments, the source electrode extends directly above the portion of the first dielectric layer.

In some embodiments, the method further includes performing a third patterning process on the second dielectric layer to form a second recess between the first recess and the drain structure, wherein the source electrode extends into the second recess.

In some embodiments, the method further includes forming a source contact on the third dielectric layer, wherein the source contact is electrically connected to the source electrode.

In some embodiments, the source contact extends directly above the first recess.

In some embodiments, the method further includes performing a fourth patterning process on the third dielectric layer to form a third recess between the first recess and the drain structure, wherein the source contact extends into the third recess.

BRIEF DESCRIPTION OF THE DRAWINGS

The disclosure can be more fully understood from the following detailed description when read with the accompanying figures. It is worth noting that, in accordance with standard practice in the industry, various features are not drawn to scale. In fact, the dimensions of the various features may be arbitrarily increased or reduced for clarity of discussion.

DETAILED DESCRIPTION

The following outlines several embodiments so that those skilled in the art may better understand the present disclosure. However, these embodiments are examples only and are not intended to limit the present disclosure. It is understandable that those skilled in the art may adjust the embodiments described below according to requirements, for example, changing the order of processes and/or including more or fewer steps than described herein.

Furthermore, other elements may be added on the basis of the embodiments described below. For example, the description of "forming a second element on a first element" may include embodiments in which the first element is in direct contact with the second element, and may also include embodiments in which additional elements are disposed between the first element and the second element such that the first element and the second element are not in direct contact, and spatially relative descriptors of the first element and the second element may change as the device is operated or used in different orientations. In addition, the present disclosure may repeat reference numerals and/or letters in the various examples. This repetition does not in itself dictate a relationship between the various embodiments and/or configurations discussed.

A high electron mobility transistor (HEMT) device and a method for forming the same are described in accordance with some embodiments of the present disclosure, and are particularly applicable to a gallium nitride HEMT device. The present disclosure provides dielectric layers having different thicknesses in a HEMT device, so that the source field plate can shield the electric field and improve the problem of charge trapping.

Figure 1A:
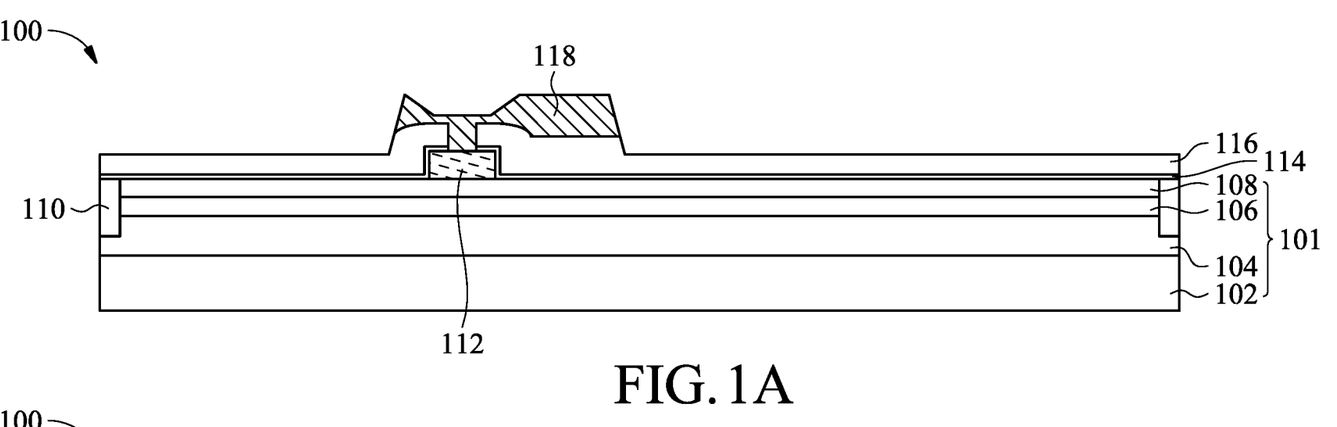
FIGS. 1A-1E are cross-sectional views illustrating a high electron mobility transistor device at various stages of manufacture in accordance with some embodiments of the present disclosure.

FIGS. 1A-1E are cross-sectional schematic views illustrating a HEMT device 100 at various stages of manufacture in accordance with some embodiments. In some embodiments, the HEMT device 100 includes a substrate 102, as illustrated in FIG. 1A. Any substrate material suitable for HEMT devices may be used. The substrate 102 may be a bulk semiconductor substrate or include a composite substrate formed of different materials, and the substrate 102 may be doped (for example, using p-type or n-type dopants) or undoped. In some embodiments, the substrate 102 may include a semiconductor substrate, a glass substrate, or a ceramic substrate, such as a silicon substrate, a silicon germanium substrate, a silicon carbide, an aluminum nitride substrate, a sapphire substrate, the like, or a combination thereof. In some embodiments, the substrate 102 may include a semiconductor-on-insulator (SOI) substrate formed by disposing a semiconductor material on an insulating layer.

In some embodiments, a buffer layer 104 is formed over the substrate 102 to relieve the lattice mismatch between the substrate 102 and the layer on the buffer layer 104, and improve the crystalline quality. In some embodiments, the buffer layer 104 may include a group III-V compound semiconductor material, such as a group III nitride. For example, the buffer layer 104 may include gallium nitride (GaN), aluminum nitride (AlN), aluminum gallium nitride (AlGaN), aluminum indium nitride (AlInN), the like, or a combination thereof. In some embodiments, the buffer layer 104 may be formed by a deposition process, such as chemical vapor deposition (CVD), atomic layer deposition (ALD), molecular beam epitaxy (MBE), liquid phase epitaxy (LPE), the like, or a combination thereof.

In addition, although in the embodiment illustrated in FIG. 1A, the buffer layer 104 is directly formed on the substrate 102, in other embodiments, a nucleation layer (not illustrated) may be formed on the substrate 102 before the buffer layer 104 is formed to further relieve the lattice mismatch between the buffer layer 104 and the substrate 102, and improve the crystal quality. In some embodiments, the nucleation layer may include a group III-V compound semiconductor material, such as a group III nitride.

Then, the channel layer 106 is formed on the buffer layer 104. In some embodiments, the channel layer 106 may include one or more group 111-V compound semiconductor materials, such as a group 111 nitride, in accordance with some embodiments. In some embodiments, the channel layer 106 is, for example, GaN, AlGaN, InGaN, InAlGaN, the like, or a combination thereof. Further, the channel layer 106 may be doped or undoped. According to some embodiments, the channel layer 106 may be formed by a deposition process, such as CVD, ALD, MBE, LPE, the like, or a combination thereof.

Then, a barrier layer 108 is formed on the channel layer 106 to create a two-dimensional electron gas (2DEG) at the interface between the channel layer 106 and the barrier layer 108, in accordance with some embodiments. The barrier layer 108 may be formed by a deposition process, such as CVD, ALD, MBE, LPE, the like, or a combination thereof. In some embodiments, the barrier layer 108 may include a group III-V compound semiconductor material, such as a group III nitride. For example, the barrier layer 108 may include AlN, AlGaN, AlInN, AlGaInN, the like, or a combination thereof. The barrier layer 108 may include a single layer or a multilayer structure, and the barrier layer 108 may be doped or undoped. For simplicity, the substrate 102, the buffer layer 104, the channel layer 106, and the barrier layer 108 may be collectively referred to as a semiconductor layer 101.

Then, an isolation structure 110 is provided. In some embodiments, a mask layer (not illustrated) is disposed on the semiconductor layer 101 and then an etching, process is performed to etch the semiconductor layer 101 into a trench using the mask layer as an etch mask, in accordance with some embodiments. For example, the mask layer may include a photoresist, such as a positive photoresist or a negative photoresist. In some embodiments, the mask layer may include a hard mask and may include silicon oxide ($SiO_2$), silicon nitride (SiN), silicon oxynitride (SiON), silicon carbide (SiC), silicon carbonitride (SiCN), the like, or a combination thereof. The mask layer may be a single layer or a multilayer structure. The mask layer may be formed by a deposition process, a photolithography process, other suitable processes, or a combination thereof. In some embodiments, the deposition process includes spin-on coating, CVD, ALD the like, or a combination thereof. For example, the photolithography process may include photoresist coating (for example, spin coating), soft baking, mask aligning, exposure, post-exposure baking (PEB), developing, rinsing, drying (for example, hard baking), other suitable processes, or a combination thereof.

In some embodiments, the etching process may include a dry etching process, a wet etching process, or a combination thereof. For example, the dry etching process may include reactive ion etch (RIE), inductively-coupled plasma (ICP) etching, neutral beam etch (NBE), electron cyclotron resonance (ERC) etching, the like, or a combination thereof. For example, the wet etching process may use, for example, hydrofluoric acid (HF), ammonium hydroxide ($NH_4OH$), or any suitable etchant.

Then, an insulating material is deposited in the trench to form the isolation structure 110, in accordance with some embodiments. In some embodiments, the insulating material may be deposited by metal organic chemical vapor deposition (MOCVD), ALD, MBE, LPE, the like, or a combination thereof. In some embodiments, the insulating material may include, for example, an oxide such as silicon oxide, a nitride such as silicon nitride, the like, or a combination thereof.

Then, a compound semiconductor layer 112 is disposed on the barrier layer 108 to vacate the 2DEG under a gate to achieve a normally-off state of the semiconductor device, in accordance with some embodiments. In some embodiments, a material of the compound semiconductor layer 112 is formed on the barrier layer 108 by a deposition process. For example, the deposition process includes CVD, ALD, MBE, LPE, the like, or a combination thereof. In some embodiments, the material of the compound semiconductor layer 112 includes u-type, n-type, or p-type doped gallium nitride, and may be doped using a dopant.

Then, a patterning process is performed to adjust the position of the compound semiconductor layer 112 according to a predetermined position of the gate, in accordance with some embodiments. In some embodiments, the patterning process includes forming a mask layer (not illustrated) on the deposited material layer, then etching the portion of the deposited material layer that is not covered by the mask layer, and forming the compound semiconductor layer 112. The examples of materials and formation of the mask layer and the etching process are as described above, and will not be repeated again.

Then, a dielectric layer 114 is conformally formed on the barrier layer 108, the isolation structure 110, and the compound semiconductor layer 112, in accordance with some embodiments. In some embodiments, the dielectric layer 114 may include any suitable dielectric material, such as silicon oxide, silicon nitride, silicon oxynitride, low-k dielectric material, aluminum oxide, aluminum nitride, the like, or a combination thereof. In some embodiments, the dielectric layer 114 may be formed by a deposition process, such as a CVD process, an ALD process, a spin coating process, the like, or a combination thereof.

Then, a dielectric layer 116 is formed on the dielectric layer 114, in accordance with some embodiments. In some embodiments, the material and formation of dielectric layer 116 may be selected from the materials and formation of dielectric layer 114 as described above.

Then, the dielectric layers 114 and 116 are patterned to etch openings in the dielectric layers 114 and 116, in accordance with some embodiments. The example of the patterning process is as described above, and will not be described again. Then, a gate electrode 118 is formed on the dielectric layer 116 and in the opening, in accordance with some embodiments. In some embodiments, the gate electrode 118 includes a conductive material, such as metal, metal silicide, the like, or a combination thereof. For example, the metal may be gold (Au), nickel (Ni), platinum (Pt), palladium (Pd), iridium (Ir), titanium (Ti), chromium (Cr), tungsten (W), aluminum (Al), copper (Cu), the like, an alloy thereof, or a combination thereof. In some embodiments, the gate electrode 118 may be formed by physical vapor deposition (PVD), CVD, ALD, evaporation, sputtering, the like, or a combination thereof.

Then, the gate electrode 118 is patterned, in accordance with some embodiments. The example of the patterning process is as described above, and will not be repeated again. As illustrated in FIG. 1A, after the patterning process, the width of the gate electrode 118 is greater than the width of the compound semiconductor layer 112, in accordance with some embodiments.

Figure 1B:
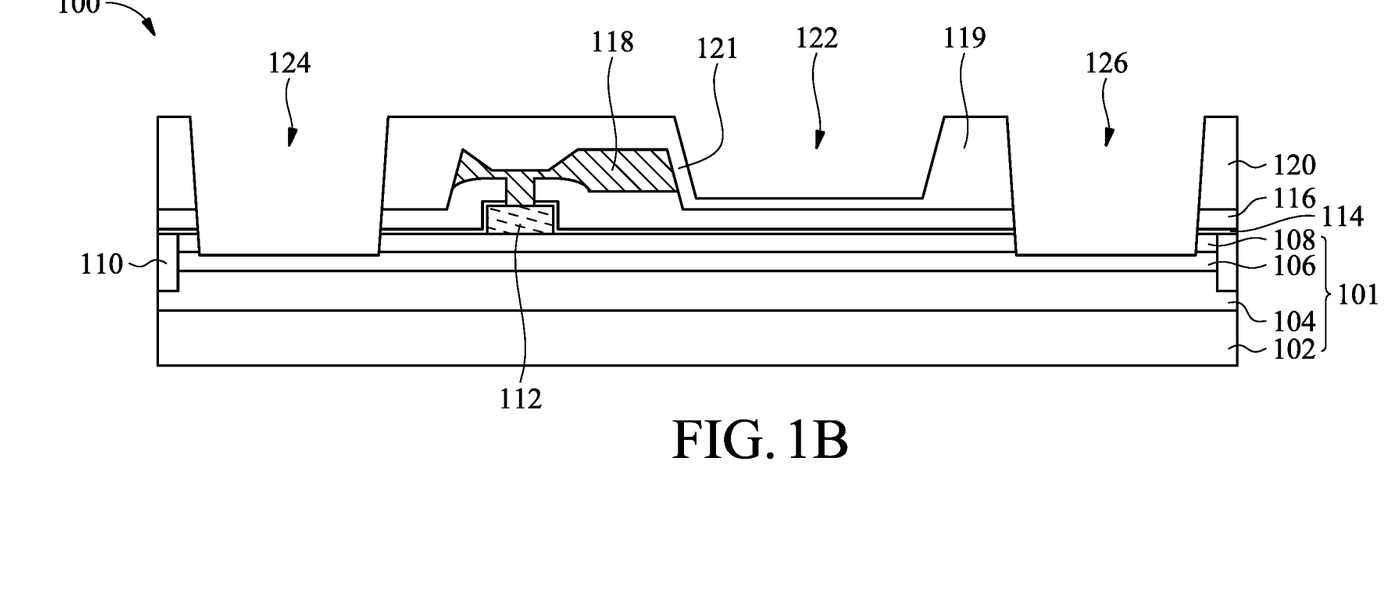

Then, as illustrated in FIG. 1B, a dielectric layer 120 is formed on the dielectric layer 116 and the gate electrode 118, in accordance with some embodiments. In some embodiments, the dielectric layer 120 may include any suitable dielectric material, such as silicon oxide, silicon nitride, silicon oxynitride, low-k dielectric material, aluminum oxide, aluminum nitride, the like, or a combination thereof. In some embodiments, the dielectric layer 120 may be formed by a deposition process, such as a CVD process, an ALD process, a spin coating process, the like, or a combination thereof. Then, after the dielectric layer 120 is deposited, the dielectric layer 120 is subjected to a planarization process, such as a chemical mechanical polishing (CMP) process, in accordance with some embodiments.

Then, the first patterning process is performed on the dielectric layer 120 to form a first recess 122 on a first side of the gate electrode 118, and a second patterning process is performed to form a through hole 126 and a through hole 124 on the first side and a second side of the electrode 118, respectively, wherein the first recess 122 is between the through hole 126 and the gate electrode 118, in accordance with some embodiments. The example of the patterning process is as described above, and will not be repeated again. The first patterning process may be performed before, during, or after the second patterning process, and the through hole 126 may be formed before, during, or after the through hole 124.

As illustrated in FIG. 1B, there is a first portion 119 of the dielectric layer 120 between the through hole 126 and the first recess 122, and a second portion 121 of the dielectric layer 120 between the through hole 124 and the first recess 122, in accordance with some embodiments. As illustrated in FIG. 1B, the width of the first recess 122 is greater than the width of the first portion 119 of the dielectric layer 120, in accordance with some embodiments. In another embodiments, the position and/or the shape of the first recess 122 may be adjusted such that the width of the first recess 122 is less than or substantially equal to the width of the first portion 119 of the dielectric layer 120. As illustrated in FIG.

1B, the bottom surface of the first recess 122 is lower than the top surface of the gate electrode 118, in accordance with some embodiments.

Figure 1C:
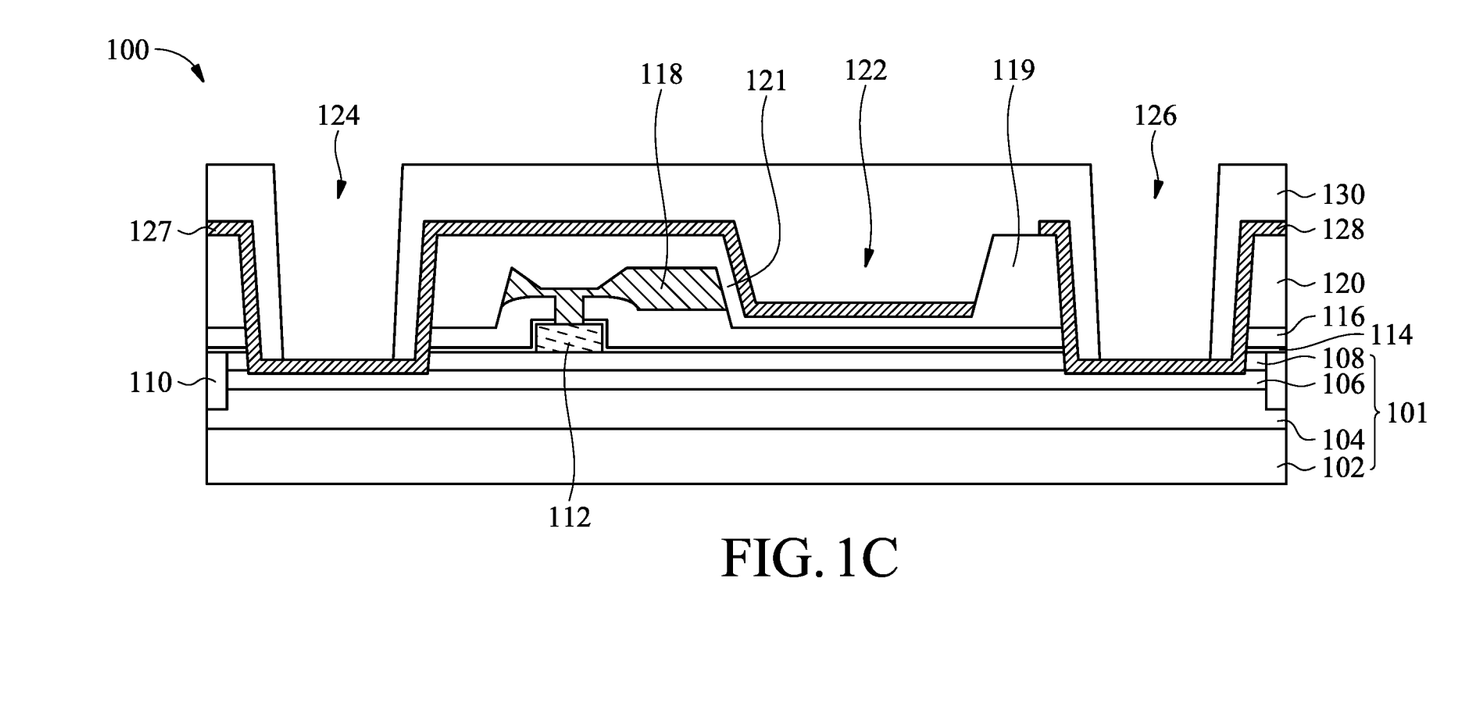

Then, as illustrated in FIG. 1C, a source field plate 127 and a conductive layer 128 are disposed on the dielectric layer 120, in accordance with some embodiments. In some embodiments, a conductive material is formed on the dielectric layer 120 by a deposition process, and the conductive material on the first portion 119 of the dielectric layer 120 is etched to expose the first portion 119 of the dielectric layer 120 and form the source field plate 127 and the conductive layer 128. Examples of conductive materials, deposition processes, and etching processes are described above and will not be repeated again. In some embodiments, the source field plate 127 does not cover the first portion 119 of the dielectric layer 120 can reduce the risk of shorting between the source field plate 127 and the conductive layer 128.

In the off state, leakage currents may occur in the HEMT device and may be trapped by the interface as they flow past the interface. As illustrated in FIG. 1C, the source field plate 127 extends from the second side of the gate electrode 118 into the first recess 122 such that the source field plate 127 covers the second portion 121 of the dielectric layer 120 to reduce charge accumulation caused by the interface leakage currents, and to block the effect of the electric field from the drain electrode on the gate electrode 118, thereby improving the performance of the HEMT device 100, in accordance with some embodiments.

Then, as illustrated in FIG. 1C, a dielectric layer 130 is formed on the source field plate 127 and the conductive layer 128, in accordance with some embodiments. In some embodiments, the dielectric layer 130 may be formed by a deposition process and a planarization process, and the material and formation of the dielectric layer 130 may be selected from the materials and formation of the dielectric layer 120 as described above. Then, the dielectric layer 130 is patterned to form the through hole 124 and the through hole 126 again, which expose the source field plate 127 and the conductive layer 128, respectively, in accordance with some embodiments. The examples of the patterning process are as described above, and will not be repeated again.

Figure 1D:
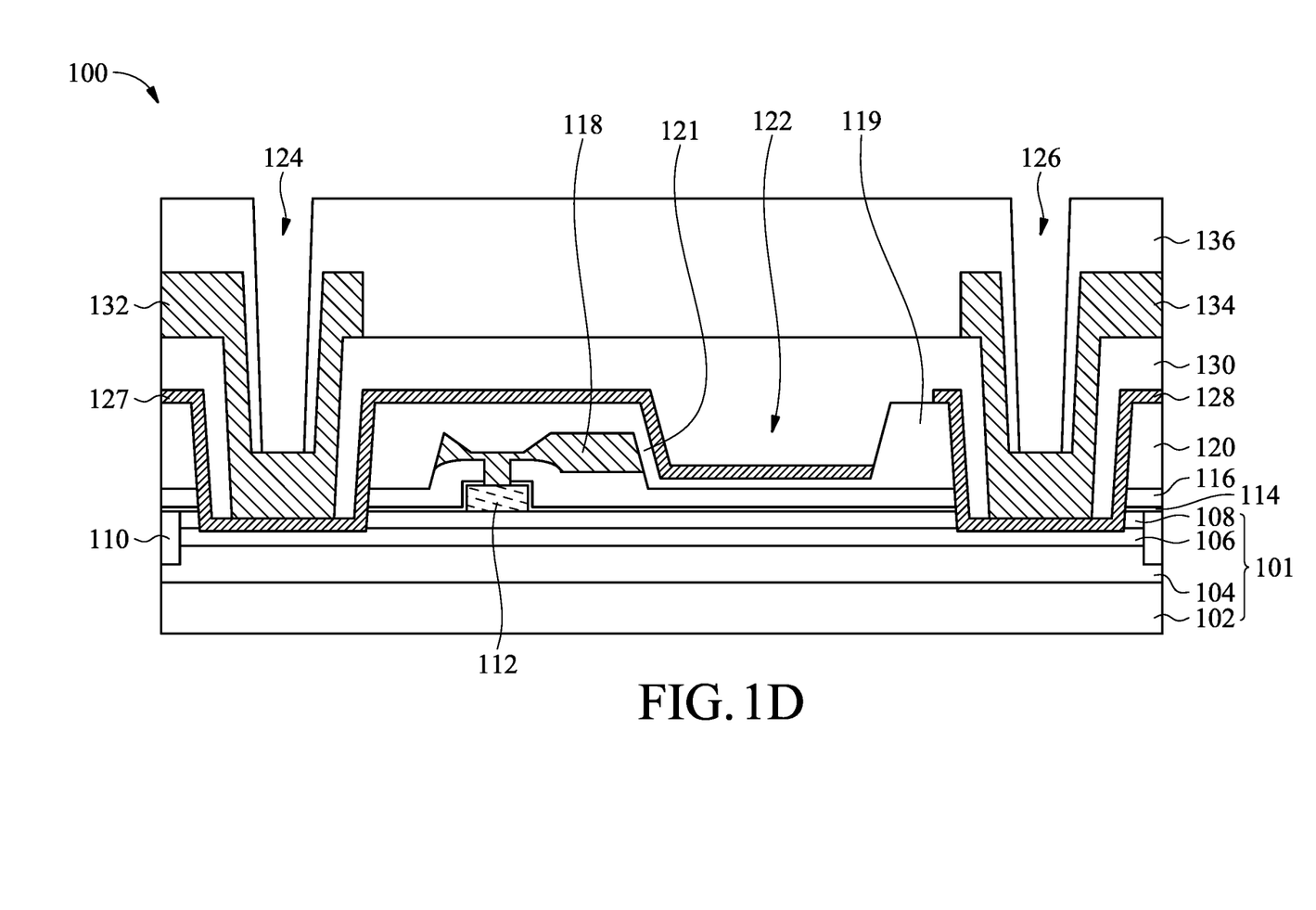

Then, as illustrated in FIG. 1D, a source electrode 132 and a drain electrode 134 are disposed on the dielectric layer 130, in accordance with some embodiments. In some embodiments, a conductive material is formed on the dielectric layer 130 by a deposition process, and the conductive material is patterned to form the source electrode 132 and the drain electrode 134. In some embodiments, the source electrode 132 and the drain electrode 134 are electrically connected to the source field plate 127 and the conductive layer 128 via the through hole 124 and the through hole 126, respectively. Examples of conductive materials, deposition processes, and patterning processes are described above, and will not be repeated again.

Then, a dielectric layer 136 is formed on the source electrode 132 and the drain electrode 134, in accordance with some embodiments. In some embodiments, the dielectric layer 136 may be formed by a deposition process and a planarization process, and the material and formation of the dielectric layer 136 may be selected from the materials and formation of the dielectric layer 120 as described above. Then, the dielectric layer 136 is patterned to form the through hole 124 and the through hole 126 again to expose the source electrode 132 and the drain electrode 134, respectively, in accordance with some embodiments. The examples of the patterning, process are as described above, and will not be repeated again.

Figure 1E:
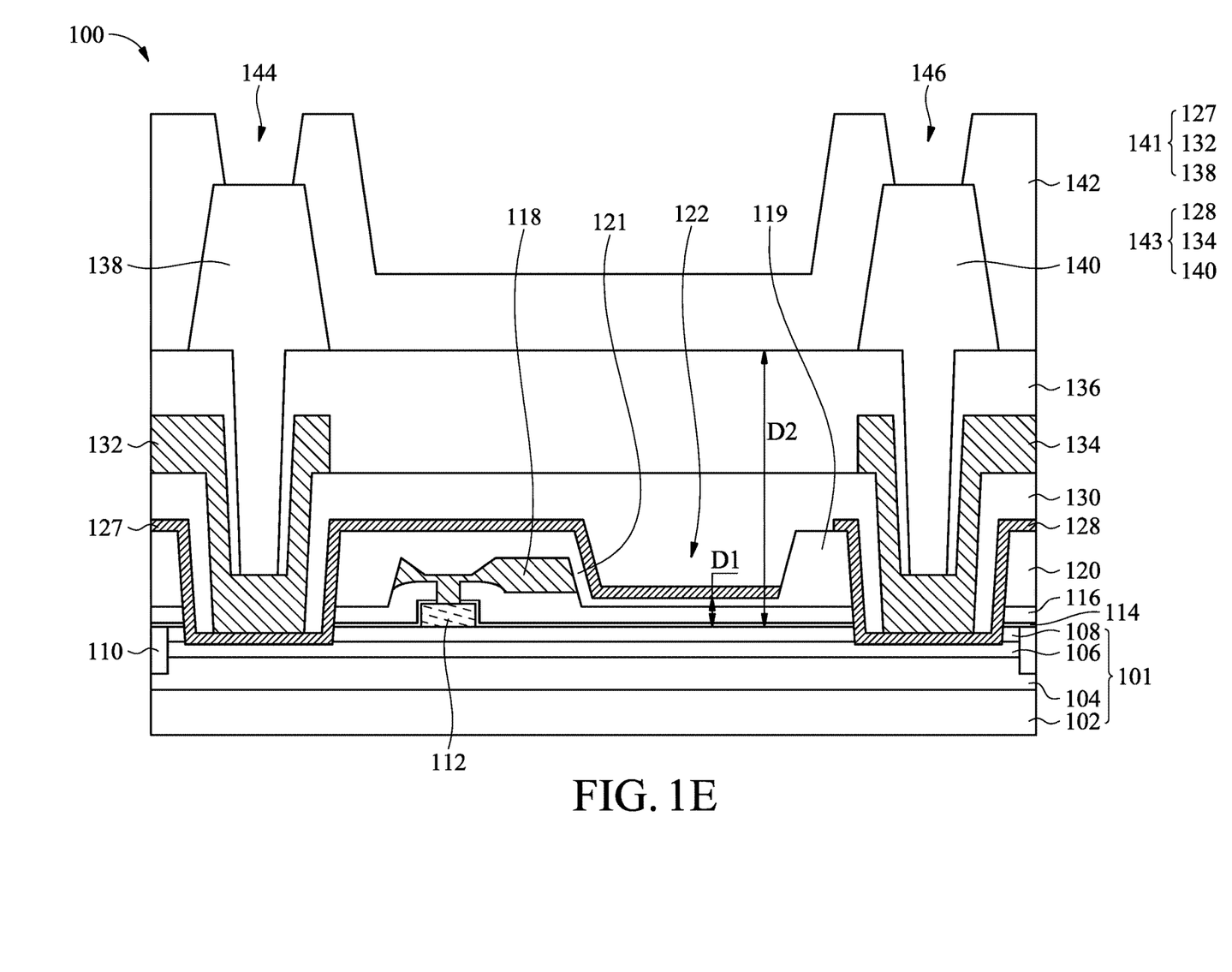

Then, as illustrated in FIG. 1E, a source contact 138 and a drain contact 140 are disposed on the dielectric layer 136, in accordance with some embodiments. In some embodiments, a conductive material is formed on the dielectric layer 130 by a deposition process, and the conductive material is patterned to form the source contact 138 and the drain contact 140. In some embodiments, the source contact 138 and the drain contact 140 are electrically connected to the source electrode 132 and the drain electrode 134 via the through hole 124 and the through hole 126 (FIG. 1D), respectively. Examples of conductive materials, deposition processes, and patterning processes are described above and will not be repeated again. For simplicity, the source field plate 127, the source electrode 132, and the source contact 138 may be collectively referred to as a source structure 141, and the conductive layer 128, the drain electrode 134, and the drain contact 140 may be collectively referred to as a drain structure 143.

In some embodiments, as illustrated in FIG. 1E, there is a distance D1 between a bottom surface of the source field plate 127 in the first recess 122 and a top surface of the barrier layer 108, and there is a distance D2 between a portion of a top surface of the dielectric layer 136 adjacent to the drain contact 140 and a top surface of the barrier layer 108, wherein the distance D2 is greater than the distance D1. The smaller distance D1 allows the source field plate 127 to block the effect of the electric field from the drain structure 143 on the gate electrode 118 and to absorb the charge accumulation due to the interface leakage current, and the larger distance D2 can make a top of the drain contact 140 away from the gate electrode 118 to reduce the effect of the electric field from the top of the drain contact 140 on the gate electrode 118, thereby improving the performance and reliability of the HEMT device 100.

Then, a protective layer 142 is formed on the source contact 138 and the drain contact 140 to block moisture, in accordance with some embodiments. In some embodiments, the protective layer 142 may include any suitable dielectric material such as silicon oxide, silicon nitride, silicon oxynitride, low-k dielectric material, aluminum oxide, aluminum nitride, the like, or a combination thereof. In some embodiments, the protective layer 142 may be formed by a deposition process, such as a CVD process, an ALD process, a spin coating process, the like, or a combination thereof. Then, the protective layer 142 is patterned to form an opening 144 and an opening 146 that expose the source contact 138 and the drain contact 140, respectively, in accordance with some embodiments.

In the above embodiment, the present disclosure forms the dielectric layer 120, the dielectric layer 130, and the dielectric layer 136 by patterning processes and planarization processes, so that the source field plate 127 formed on the dielectric layer 120 can cover the gate electrode 118, and the top of the drain contact 140 formed on the dielectric layer 136 can be spaced apart from the gate electrode 118 to block and reduce the effect of the electric field from the drain structure 143 on the gate electrode 118, and the extended source field plate 127 can also improve the problem of charge trapping, thereby improving the performance of the HEMT device 100.

Figure 2:
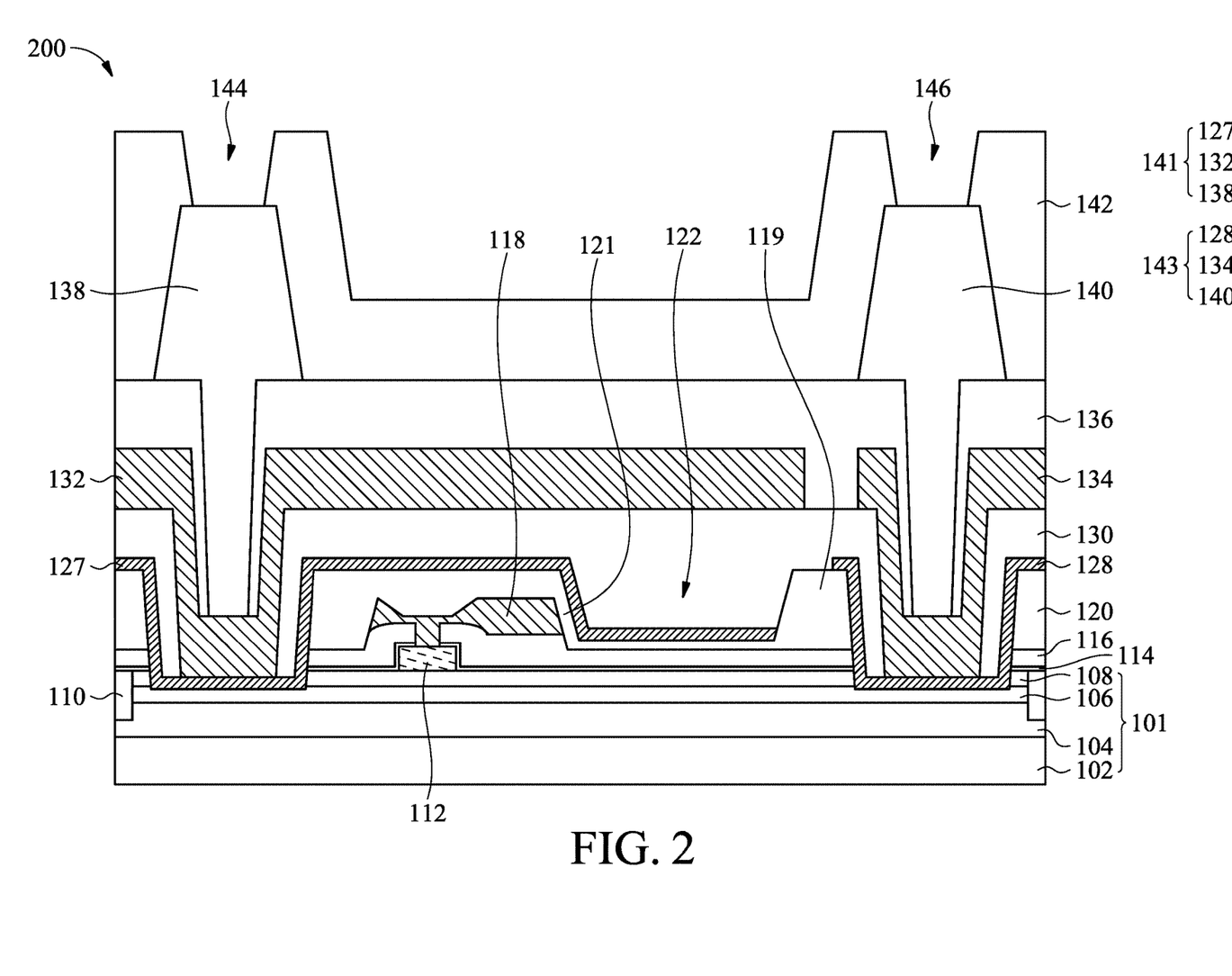
FIG. 2 is a cross-sectional view illustrating a high electron mobility transistor device in accordance with another embodiment of the present disclosure.
Figure 3:
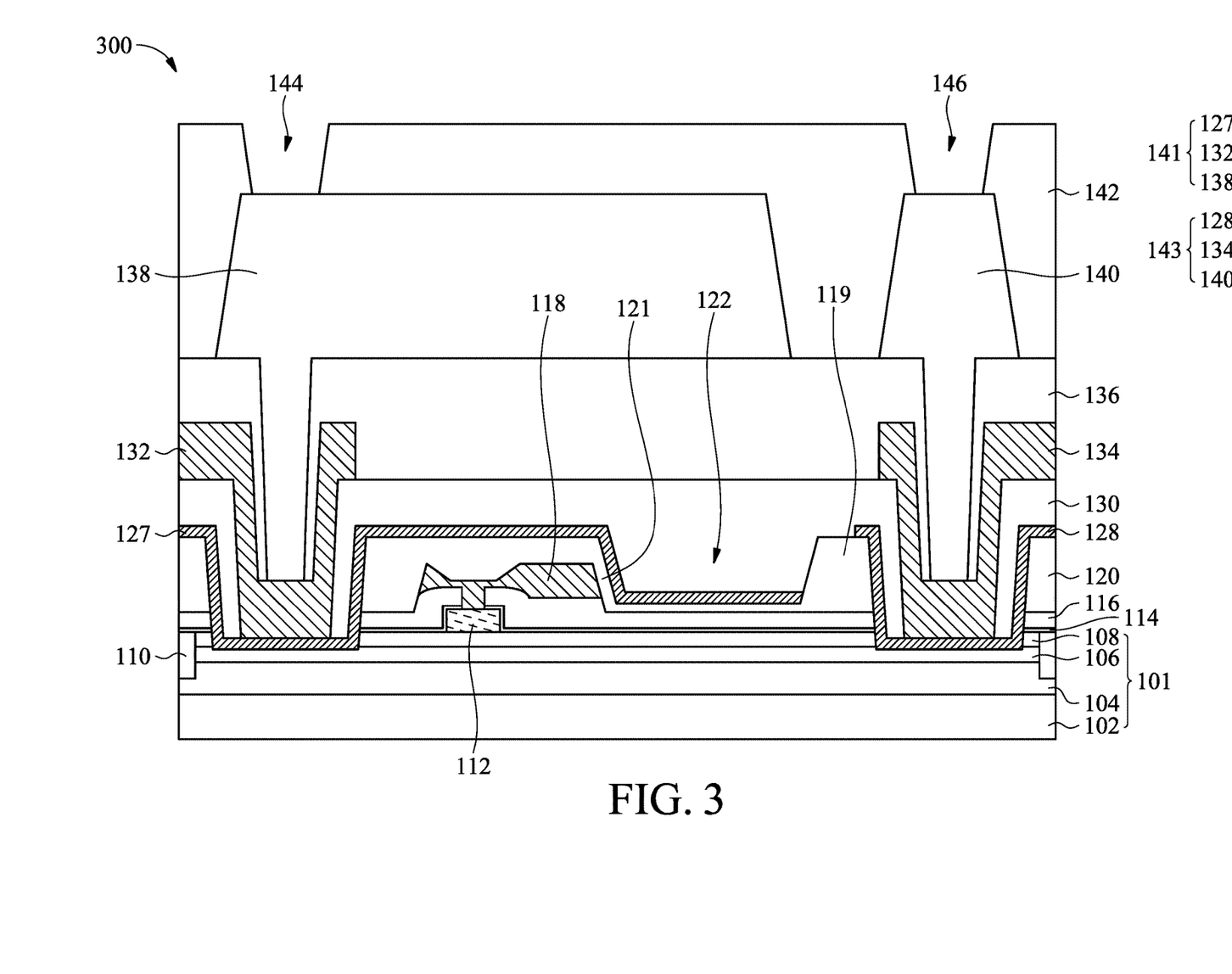
FIG. 3 is a cross-sectional view illustrating a high electron mobility transistor device in accordance with another embodiment of the present disclosure.
Figure 4:
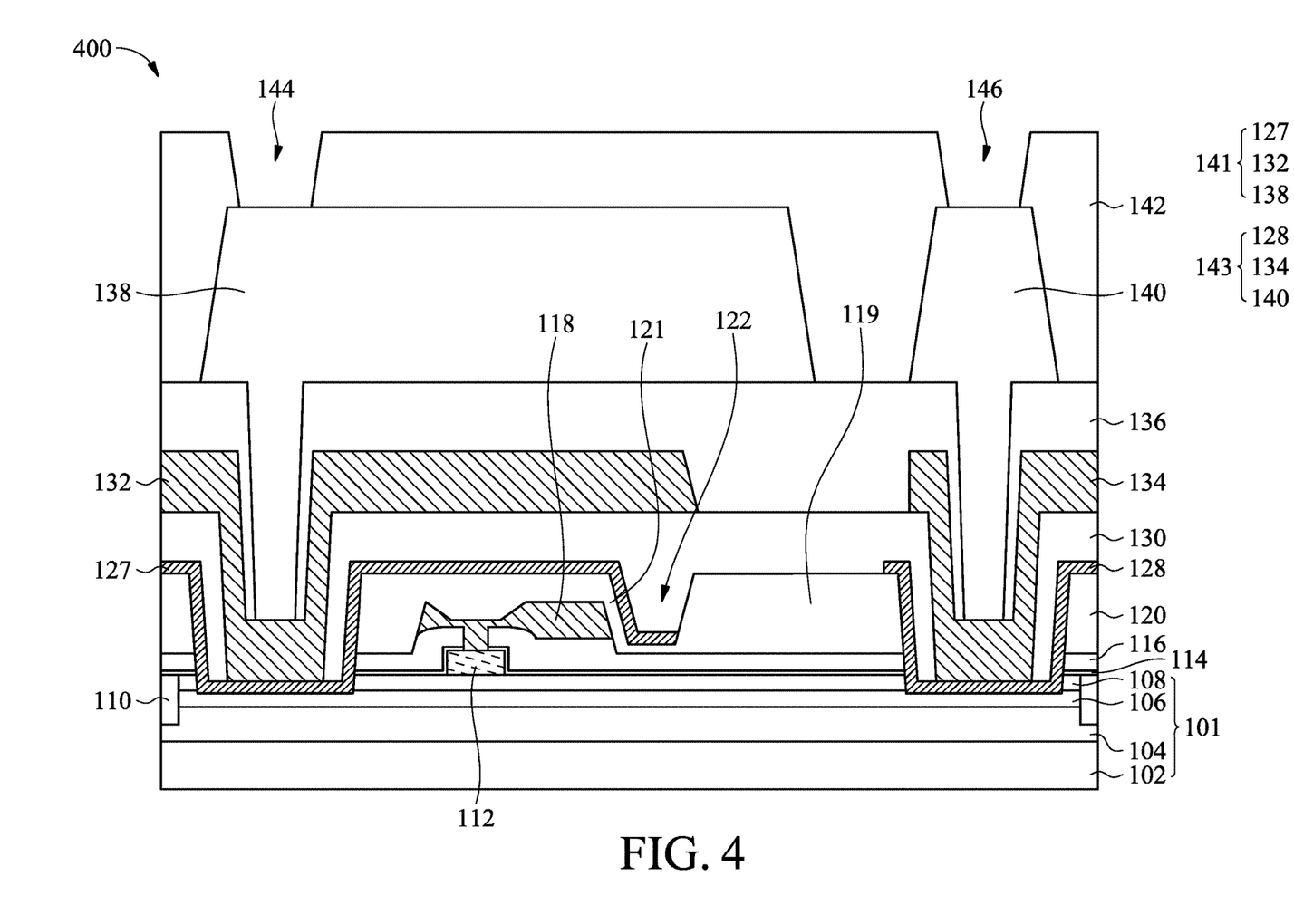
FIG. 4 is a cross-sectional view illustrating a high electron mobility transistor device in accordance with another embodiment of the present disclosure.

FIGS. 2, 3, and 4 are cross-sectional views illustrating HEMT devices 200, 300, and 400, in accordance with some embodiments. Similarly, the manufacturing processes of the embodiments of FIGS. 2-4 are substantially the same as those of FIGS. 1A-1E. For simplicity, the same elements will be described below with the same reference numerals, the materials and formation methods of these elements are as described above, and will not be repeated again. In contrast to the embodiments illustrated in FIGS. 1A-1E, the following embodiments will adjust the position of the source electrode 132 and/or the source contact 138 to further shield the electric field and improve the problem of charge trapping.

In some embodiments, the source electrode 132 extends from the second side of the gate electrode 118 to the first side of the gate electrode 118, as illustrated in FIG. 2. The position of the source electrode 132 may be adjusted such that the source electrode 132 extends directly above the first recess 122. In some embodiments, the source electrode 132 may extend further directly above the first portion 119 of the dielectric layer 120.

In some embodiments, the source contact 138 extends from the second side of the gate electrode 118 to the first side of the gate electrode 118, as illustrated in FIG. 3. The position of the source contact 138 may be adjusted such that the source contact 138 extends directly above the first recess 122. In some embodiments, the source contact 138 may extend further directly above the first portion 119 of the dielectric layer 120. Additionally, the position of the protective layer 142 may be adjusted according to the position of the source contact 138 to cover the source contact 138.

In some embodiments, the source electrode 132 and the source contact 138 extend from the second side of the gate electrode 118 to the first side of the gate electrode 118, as illustrated in FIG. 4. The position of the source electrode 132 and the position of the source contact 138 may be adjusted such that the source electrode 132 and the source contact 138 extend directly above the first recess 122. In some embodiments, the source electrode 132 and the source contact 138 may extend directly above the first portion 119 of the dielectric layer 120. As previously mentioned, the position of the protective layer 142 may be adjusted according to the position of the source contact 138 to cover the source contact 138.

Further, in the embodiments of FIGS. 1A-1E, 2, and 3, the width of the first recess 122 is larger than the width of the first portion 119 of the dielectric layer 120, but the present disclosure is not limited thereto. In some embodiments, the width of the first recess 122 is less than the width of the first portion 119 of the dielectric layer 120, as illustrated in FIG. 4. In other embodiments, the width of the first recess 122 is substantially equal to the width of the first portion 119 of the dielectric layer 120.

In the above embodiment, the present disclosure extends the source electrode 132 and/or the source contact 138 toward the gate structure 143 to block the effect of the electric field from the drain structure 143 on the gate electrode 118, and the extended source electrode 132 and/or the extended source contact 138 can improve the problem of charge trapping, thereby improving the performance and reliability of the HEMT devices 200, 300, and 400.

Figure 5:
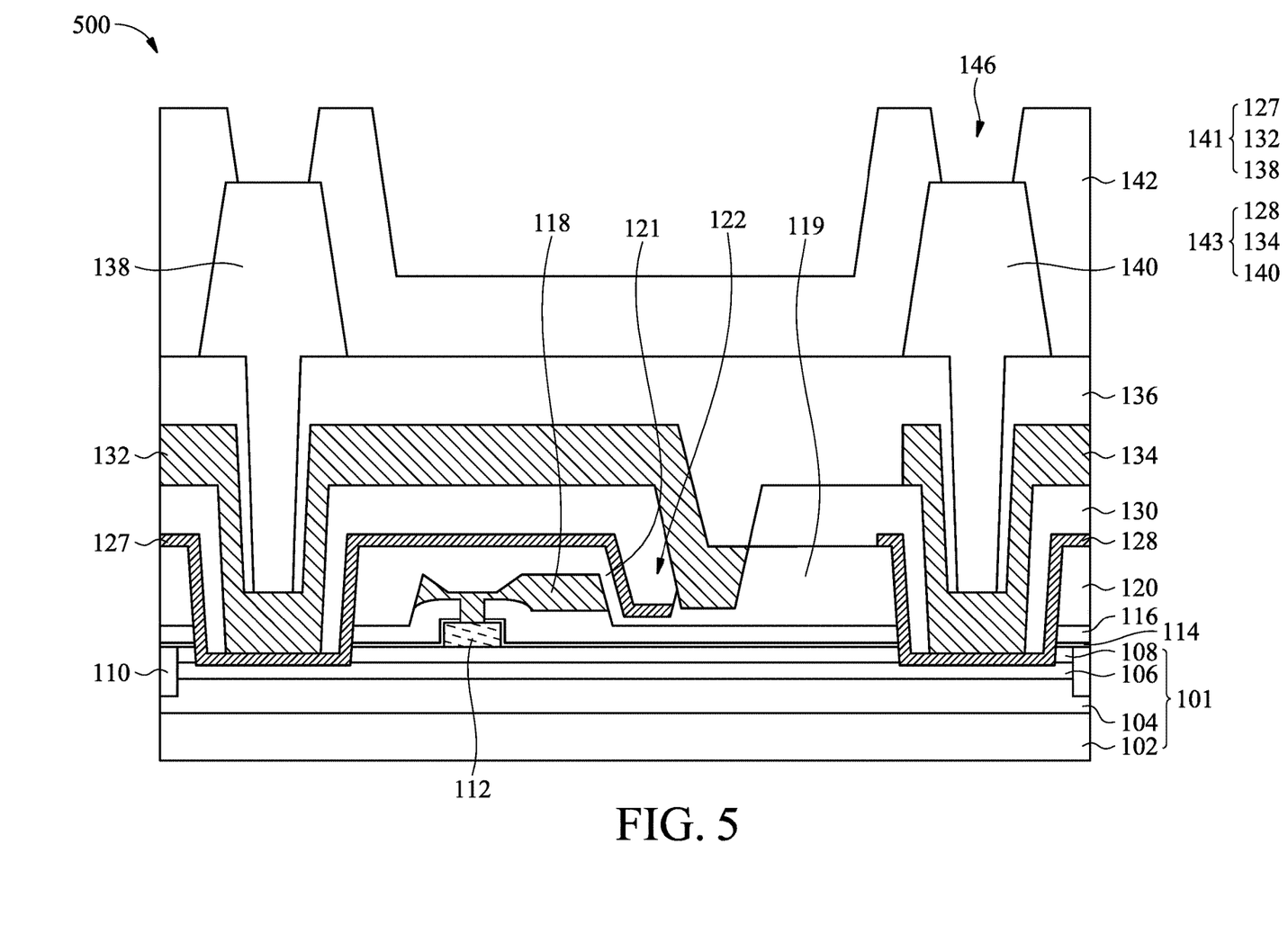
FIG. 5 is a cross-sectional view illustrating a high electron mobility transistor device in accordance with another embodiment of the present disclosure.

FIG. 5 is a cross-sectional view illustrating a HEMT device 500, in accordance with some embodiments. Similarly, the manufacturing processes of the embodiment of FIG. 5 are substantially the same as those of FIGS. 1A-1E, the difference being that a second recess 148 is provided and the source electrode 132 extends into the second recess 148. For simplicity, the same elements will be described below with the same reference numerals, the materials and formation methods of these elements are as described above, and will not be repeated again.

In some embodiments, continuing with the steps in FIG. 1C after the dielectric layer 130 is formed, the dielectric layer 130 is patterned to form the second recess 148, wherein the second recess 148 is located between the first recess 122 and the drain structure 143. The examples of the patterning process are as described above, and will not be repeated again. Then, as illustrated in FIG. 5, the source electrode 132 and the drain electrode 134 are formed on the patterned dielectric layer 130, wherein the source electrode 132 extends into the second recess 148 and does not cover a portion of the dielectric layer 130 between the second recess 148 and the drain electrode 134, in accordance with some embodiments.

The patterning process may be adjusted to change the depth of the second recess 148. In some embodiments, the bottom surface of the second recess 148 is not lower than the bottom surface of the first recess 122, as illustrated in FIG. 5. In some embodiments, the bottom surface of the second recess 148 is located in the first portion 119 of the dielectric layer 120.

Figure 6:
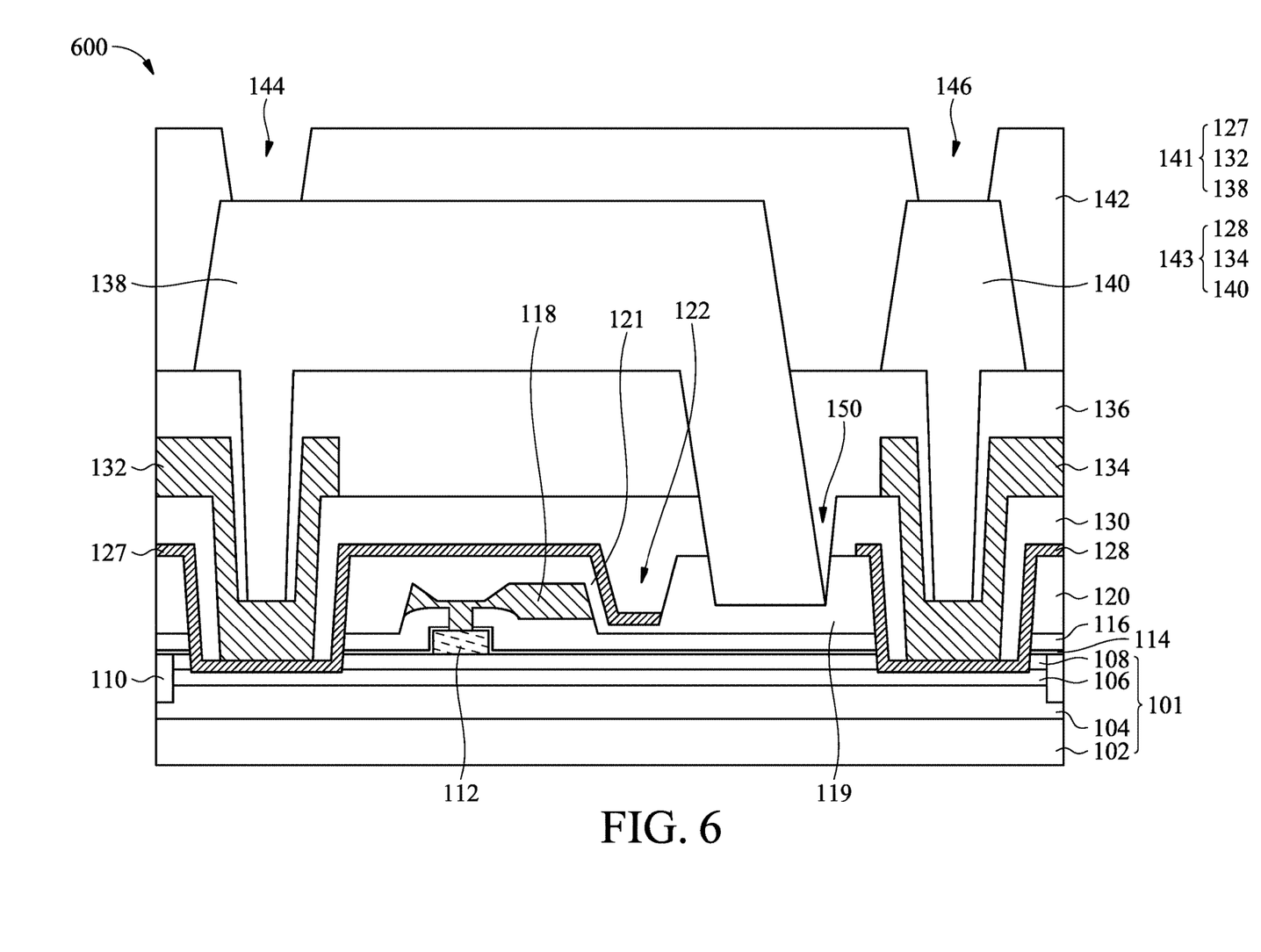
FIG. 6 is a cross-sectional view illustrating a high electron mobility transistor device in accordance with another embodiment of the present disclosure.

FIG. 6 is a cross-sectional view illustrating a HEMT device 600, in accordance with some embodiments. Similarly, the manufacturing processes of the embodiment of FIG. 6 are substantially the same as those of FIGS. 1A-1E, the difference being that a third recess 150 is provided and the source contact 138 is extended into the third recess 150. For simplicity, the same elements will be described below with the same reference numerals, the materials and formation methods of these elements are as described above, and will not be repeated again.

In some embodiments, continuing with the steps in FIG. 1D, after the dielectric layer 136 is formed, the dielectric layer 136 is patterned to form the third recess 150, wherein the third recess 150 is located between the first recess 122 and the drain structure 143. The examples of the patterning process are as described above, and will not be repeated again. Then, as illustrated in FIG. 6, the source contact 138 and the drain contact 140 are formed on the patterned dielectric layer 136, wherein the source contact 138 extends into the third recess 150 and does not cover a portion of the dielectric layer 136 between the third recess 150 and the drain contact 140, in accordance with some embodiments.

The patterning process may be adjusted to change the depth of the third recess 150. In some embodiments, a bottom surface of the third recess 150 is not lower than the bottom surface of the first recess 122, as illustrated in FIG. 6. In some embodiments, the bottom surface of the third recess 150 is located in the first portion 119 of the dielectric layer 120. As previously mentioned, the position of the protective layer 142 may be adjusted according to the position of the source contact 138 to cover the source contact 138.

Figure 7:
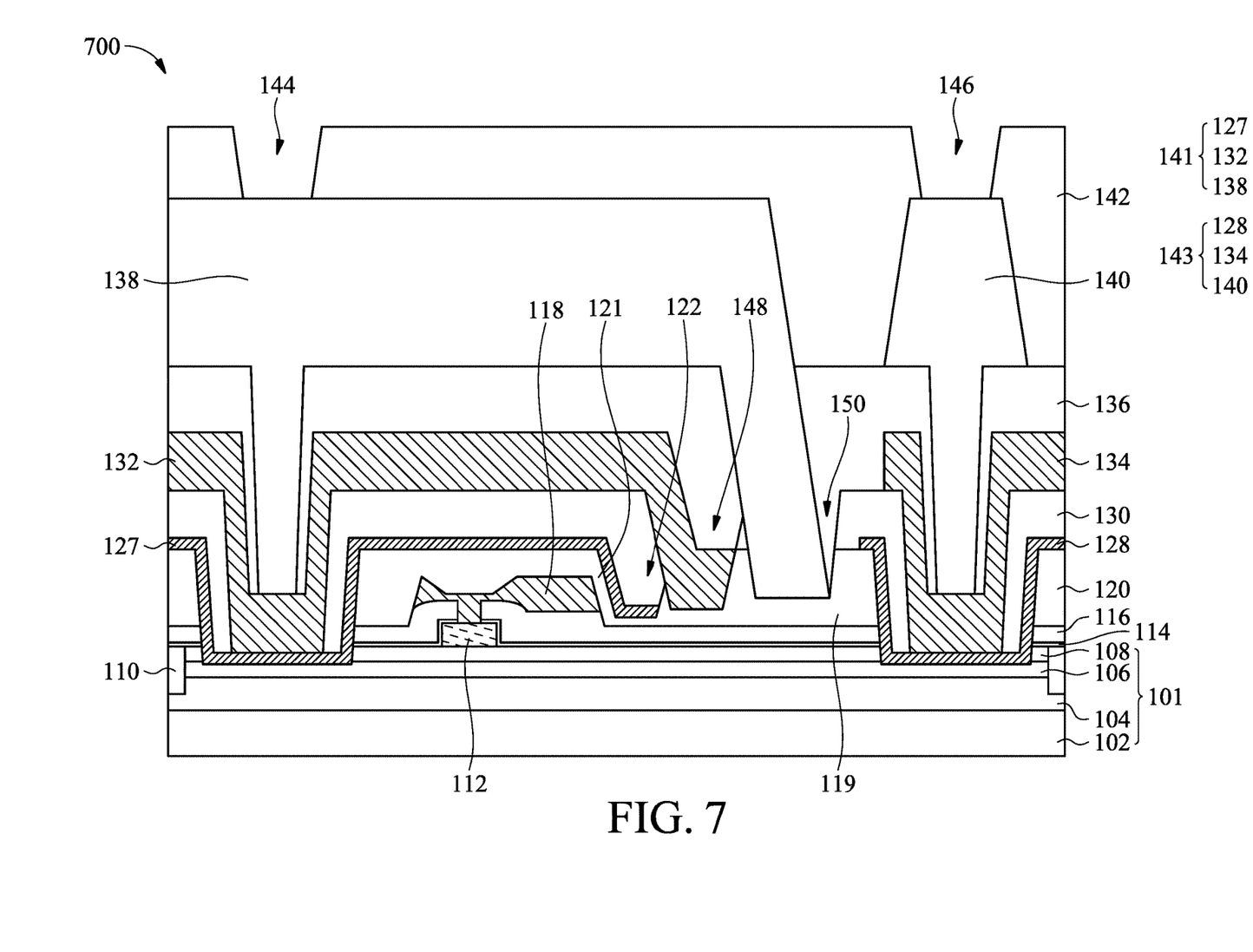
FIG. 7 is a cross-sectional view illustrating a high electron mobility transistor device in accordance with another embodiment of the present disclosure.

FIG. 7 is a cross-sectional view illustrating a HEMT device 700, in accordance with some embodiments. Similarly, the manufacturing processes of the embodiment of FIG. 7 are substantially the same as those of FIGS. 1A-1E, the difference being that the source electrode 132 extends into the second recess 148 and the source contact 138 extends into the third recess 150. For simplicity, the same elements will be described below with the same reference numerals, the materials and formation methods of these elements are as described above, and will not be repeated again.

In some embodiments, continuing with the steps in FIG. 1C, after the dielectric layer 130 is formed, the dielectric layer 130 is patterned to form the second recess 148, wherein the second recess 148 is located between the first recess 122 and the drain structure 143. The examples of the patterning process are as described above, and will not be repeated again. Then, the source electrode 132 and the drain electrode 134 are formed on the patterned dielectric layer 130, wherein the source electrode 132 extends into the second recess 148 and does not cover the portion of the dielectric layer 130 between the second recess 148 and the drain electrode 134, in accordance with some embodiments.

Then, the dielectric layer 136 is formed on the source electrode 132 and the drain electrode 134, and the dielectric layer 136 is patterned to form the third recess 150, wherein the third recess 150 is located between the second recess 148 and the drain structure 143, in accordance with some embodiments. The examples of the patterning process are as described above, and will not be repeated again. Then, the source contact 138 and the drain contact 140 are formed on the patterned dielectric layer 136, wherein the source contact 138 extends into the third recess 150 and does not cover the portion of the dielectric layer 136 between the third recess 150 and the drain contact 140, in accordance with some embodiments.

The patterning process may be adjusted to change the depth of the second recess 148 and the third recess 150. In some embodiments, the bottom surface of the second recess 148 is not lower than the bottom surface of the first recess 122, and the bottom surface of the third recess 150 is not lower than the bottom surface of the second recess 148, as illustrated in FIG. 7. In some embodiments, the bottom surface of the second recess 148 and the bottom surface of the third recess 150 are located in the first portion 119 of the dielectric layer 120. As previously mentioned, the position of the protective layer 142 may be adjusted according to the position of the source contact 138 to cover the source contact 138.

In the embodiments of FIGS. 5, 6, and 7, the source electrode 132 and/or the source contact 138 cover the gate electrode 118 to further shield the electric field and improve the problem of charge trapping, thereby improving the performance and reliability of the HEMT devices 500, 600 and 700.

In summary, the present disclosure forms dielectric layers having different thickness by patterning processes and planarization processes, wherein the dielectric layer under the source field plate is thinner, and the dielectric layer adjacent to a top of the drain structure is thicker. The thinner dielectric layer can shield the source field plate from the electric field and improve the problem of charge trapping, and the thicker dielectric layer can keep the top of the drain structure away from the gate electrode to reduce the effect of the electric field from the drain structure on the gate electrode, thereby improving the performance and reliability of the HEMT device.

Furthermore, in some embodiments, the source electrode and/or the source contact are extended toward the drain structure to block the effect of the electric field from the drain structure on the gate electrode, and the extended source electrode and/or the extended source contact can also improve the problem of charge trapping, thereby further improving the performance and reliability of the HEMT device.

In addition, in some embodiments, the source electrode and/or the source contact covers the gate electrode to block the effect of the electric field from the drain structure on the gate electrode, and the extended source electrode and/or the extended source contact can also improve the problem of charge trapping, thereby further improving the performance and reliability of the HEMT device.

While the present disclosure has been described above by various embodiments, these embodiments are not intended to limit the disclosure. Those skilled in the art should appreciate that they may make various changes, substitutions and alterations based on the embodiments of the present disclosure to realize the same purposes and/or advantages as the various embodiments described herein. Those skilled in the art should also appreciate that such design or modification practiced without does not depart from the spirit and scope of the disclosure. Therefore, the scope of protection of the present disclosure is defined as the subject matter set forth in the appended claims.

What is claimed is:

1. A high electron mobility transistor device, comprising:
a gate electrode disposed on a semiconductor layer;
a first dielectric layer disposed on the gate electrode and having a first recess on a first side of the gate electrode, wherein a bottom surface of the first recess is lower than a top surface of the gate electrode;
a source field plate disposed on the first dielectric layer and extending from a second side of the gate electrode into the first recess;
a second dielectric layer disposed on the source field plate and having a through hole on the second side of the gate electrode;
a source electrode conformally disposed in the through hole of the second dielectric layer and electrically connected to the source field plate;
a third dielectric layer disposed on the source electrode;
a source contact extending from below a topmost surface of the source field plate to above a topmost surface of the source electrode; and
a drain structure disposed on the first side of the gate electrode and passing through the third dielectric layer, wherein the first recess is located between the drain structure and the gate electrode.

2. The high electron mobility transistor device as claimed in claim 1, wherein a portion of the first dielectric layer is located between the first recess and the drain structure, and the source field plate does not cover the portion of the first dielectric layer.

3. The high electron mobility transistor device as claimed in claim 2, wherein a width of the first recess is greater than a width of the portion of the first dielectric layer.

4. The high electron mobility transistor device as claimed in claim 2, wherein a width of the first recess is less than a width of the portion of the first dielectric layer.

5. The high electron mobility transistor device as claimed in claim 2, wherein the source electrode extends directly above the portion of the first dielectric layer.

6. The high electron mobility transistor device as claimed in claim 1, wherein the second dielectric layer has a second recess located between the first recess and the drain structure, and the source electrode extends into the second recess.

7. The high electron mobility transistor device as claimed in claim 6, wherein a bottom surface of the second recess is not lower than the bottom surface of the first recess.

8. The high electron mobility transistor device as claimed in claim 7, wherein the bottom surface of the second recess is located in the first dielectric layer.

9. The high electron mobility transistor device as claimed in claim 1, wherein the source contact is disposed on the third dielectric layer and electrically connected to the source electrode.

10. The high electron mobility transistor device as claimed in claim 9, wherein the source contact extends directly above the first recess.

11. The high electron mobility transistor device as claimed in claim 9, wherein the third dielectric layer has a third recess, wherein the third recess is located between the first recess and the drain structure, and the source contact extends into the third recess.

12. The high electron mobility transistor device as claimed in claim 11, wherein a bottom surface of the third recess is not lower than the bottom surface of the first recess.

13. The high electron mobility transistor device as claimed in claim 12, wherein the bottom surface of the third recess is located in the first dielectric layer.

14. A method for forming high electron mobility transistor devices as set forth in claim 1, comprising:
   forming a gate electrode on a semiconductor layer;
   forming a first dielectric layer on the gate electrode;
   performing a first patterning process on the first dielectric layer to form a first recess on a first side of the gate electrode, wherein a bottom surface of the first recess is lower than a top surface of the gate electrode;
   performing a second patterning process on the first dielectric layer to form a first through hole on the first side of the gate electrode and form a second through hole on a second side of the gate electrode, wherein the first recess is located between the first through hole and the gate electrode;
   forming a source field plate conformally on the first dielectric layer, wherein the source field plate extends into the second through hole and the first recess;
   forming a second dielectric layer on the source field plate;
   forming a source electrode on the second dielectric layer, wherein the source electrode is electrically connected to the source field plate;
   forming a third dielectric layer on the source electrode; and
   forming a drain structure in the first through hole.

15. The method as claimed in claim 14, wherein a portion of the first dielectric layer is located between the first recess and the drain structure, and the source field plate is etched to expose the portion of the first dielectric layer.

16. The method as claimed in claim 15, wherein the source electrode extends directly above the portion of the first dielectric layer.

17. The method as claimed in claim 14, further comprising performing a third patterning process on the second dielectric layer to form a second recess between the first recess and the drain structure, wherein the source electrode extends into the second recess.

18. The method as claimed in claim 14, further comprising forming a source contact on the third dielectric layer, wherein the source contact is electrically connected to the source electrode.

19. The method as claimed in claim 18, wherein the source contact extends directly above the first recess.

20. The method as claimed in claim 18, further comprising performing a fourth patterning process on the third dielectric layer to form a third recess between the first recess and the drain structure, wherein the source contact extends into the third recess.

* * * * *